United States Patent
Walukas et al.

(10) Patent No.: US 6,169,885 B1
(45) Date of Patent: Jan. 2, 2001

(54) RADIO DEVICES INCLUDING POWER AMPLIFIER CONTROL CIRCUITS WITH HARDWARE LOCKOUTS

(75) Inventors: Joel James Walukas, Cary; Scott Yoder, Holly Springs, both of NC (US)

(73) Assignee: Ericsson Inc, Research Triangle Park, NC (US)

( * ) Notice: Under 35 U.S.C. 154(b), the term of this patent shall be extended for 0 days.

(21) Appl. No.: 09/130,497

(22) Filed: Aug. 7, 1998

(51) Int. Cl.$^7$ .................................................. H03F 3/16
(52) U.S. Cl. ......................... 455/126; 455/127; 330/297
(58) Field of Search .................. 455/78, 82, 83, 455/126, 127, 850, 573, 574, 575; 330/297, 51

(56) References Cited

U.S. PATENT DOCUMENTS

| | | | |
|---|---|---|---|
| 4,320,447 | 3/1982 | Krauss | 363/63 |
| 5,199,079 | * 3/1993 | Anderson et al. | 381/94 |
| 5,450,037 | * 9/1995 | Kanaya et al. | 330/297 |
| 5,608,763 | 3/1997 | Chiasson et al. | 375/332 |
| 5,627,458 | * 5/1997 | Nevin | 323/267 |
| 5,760,652 | * 6/1998 | Maemura et al. | 330/297 |

FOREIGN PATENT DOCUMENTS

| | | | |
|---|---|---|---|
| 0504890A2 | 3/1992 | (EP) | H04L 27/22 |
| 0731587A2 | 2/1996 | (EP) | H04L 27/22 |
| 0788244A1 | 1/1997 | (EP) | H04B 7/01 |
| WO96/10879 | 4/1996 | (WO) | H04L 27/30 |
| WO98/36580 | 8/1998 | (WO). | |

OTHER PUBLICATIONS

Prinz, Philipp, 20 W GaSa–FET Power on 13 cm, *Dubus*, vol. 1996, No. 2, pp. 20–25 (Jun. 30, 1996).
International Search Report, International Application No. PCT/US99/14289.

* cited by examiner

*Primary Examiner*—Daniel S. Hunter
*Assistant Examiner*—Pablo Tran
(74) *Attorney, Agent, or Firm*—Myers Bigel Sibley & Sajovec

(57) ABSTRACT

A battery powered radio device includes a transmitter, a control circuit, and a lockout circuit. The transmitter transmits radio communications and the transmitter includes a power amplifier which generates an amplified radiofrequency output signal. More particularly, the power amplifier uses both a positive supply voltage and a negative bias voltage for operation wherein the negative bias voltage is less than a supply ground voltage. The control circuit enables the power amplifier during transmission, and the control circuit includes a switch coupled in series between a positive supply voltage and the power amplifier. The switch is activated in response to a transmit activation signal when the negative bias voltage is coupled to the power amplifier. The lockout circuit prevents activation of the switch in response to the transmit activation signal when the negative bias voltage is not coupled to the power amplifier. In addition, the switch can be activated in response to a transmit activation signal by applying the negative bias voltage to the switch control gate and deactivated in the absence of the transmit activation signal by applying the positive supply voltage to the switch control gate.

38 Claims, 12 Drawing Sheets

RADIO DEVICES INCLUDING POWER AMPLIFIER CONTROL CIRCUITS WITH HARDWARE LOCKOUTS

FIELD OF THE INVENTION

The present invention relates to the field of radio communications and more particularly to power amplifier control circuits.

BACKGROUND OF THE INVENTION

In cellular radiotelephones according to the prior art, a power amplifier is used to amplify transmit signals to be transmitted from an antenna. As shown in FIG. 1, the power amplifier PA provides amplified transmit signals to the duplexor 23 for transmission from the antenna 21. The duplexor separates the amplified transmit signals from receive signals which are received from the antenna 21 and provided to the receiver 25. The transmission and reception of radiotelephone communications using the power amplifier, the duplexor, the receiver, and the antenna of FIG. 1 will be understood by those having skill in the art.

More particularly, the power amplifier PA can be a depletion mode n-channel GaAs FET power amplifier (GaAs PA) which uses a positive battery voltage $+V_{BAT}$ and a negative bais voltage $-V_{BIAS}$ for operation wherein the negative bias voltage $-V_{BIAS}$ is less than the battery ground voltage. Furthermore, the power amplifier PA may be damaged or destroyed if the positive battery voltage $+V_{BAT}$ is applied to the power amplifier before the negative bias voltage is applied to the power amplifier. Accordingly, the power amplifier is isolated from the positive battery voltage by the series switch Q1 which can be a p-MOSFET switch, wherein the source of the p-MOSFET switch is coupled to the positive battery voltage, the gate of the p-MOSFET switch is coupled to the node N2, and the drain of the p-MOSFET switch is coupled to the power amplifier.

As shown, the p-MOSFET switch Q1 can be activated using the control circuit including resistors R1, R2, and R3, and the switch Q2. In particular, the system controller 27 generates a logical high control signal voltage on node N1 coupled to the gate of the switch Q2 when the system controller determines that the positive battery voltage should be applied to the power amplifier. The resistor R3 pulls the node N1 to ground when the system controller output is in a high impedance state such as during power up. The switch Q2 acts as a level converter, converting logic signals (such as 0 V and 3.3 V low and high control signals) to battery control signals (0 V and $+V_{BAT}$ low and high control signals).

When the positive control signal voltage is applied to the node N1, the switch Q2 couples the node N2 to ground so that the gate of the p-MOSFET switch Q1 is grounded through the resistor R2. Accordingly, the gate-to-source voltage $V_{GS}$ for the p-MOSFET switch Q1 is set to approximately $-V_{BAT}$ causing the p-MOSFET switch Q1 to turn on. This couples the positive battery voltage to the power amplifier (PA) which can be modeled as a 10 ohm load from the switch Q1 drain to ground.

Alternately, the switch Q2 is turned off when the output of the system controller is at either a logical low state or a high impedance state so that the p-MOSFET switch Q1 gate is pulled to the positive battery voltage through resistors R1 and R2. The gate-to-source voltage $V_{GS}$ is thus zero, causing the p-MOSFET switch Q1 to be turned off, thereby isolating the power amplifier from the positive battery voltage $+V_{BAT}$.

The system controller is generally implemented as an application specific integrated circuit (ASIC) which may include a microcontroller running system firmware, and the control signal on node N1 is thus generated in accordance with the system firmware. In particular, the system firmware is designed to enable the p-MOSFET switch Q1 before transmitting but after the negative bias voltage $-V_{BIAS}$ has been applied to the power amplifier. Furthermore, the negative bias voltage $-V_{BIAS}$ may also be switched under firmware control to provide power savings when the radiotelephone is not transmitting.

Non-destructive operation of the power amplifier thus relies on proper sequencing of the system firmware and proper operation of the system controller to provide that the negative bias voltage is applied to the power amplifier before the positive battery voltage is applied to the power amplifier. Improper sequencing of the system firmware (caused by so-called firmware bugs, for example), however, can result in power amplifier failures. Corruption of the system controller (implemented as an ASIC) caused by system transients could also cause power amplifier failures.

Furthermore, the performance of the control circuit of FIG. 1 may be reduced as radiotelephones are powered by batteries having lower voltages. In particular, the gate of the p-MOSFET switch Q1 is switched between 0 V (turn on) and +VBAT (turn off). With 0 V applied to the gate, the gate-to-source voltage $V_{GS}$ is equal to $-V_{BAT}$, so that $V_{GS}$ during "turn on" is reduced with reduced battery voltages. Moreover, "on" resistances for the p-MOSFET switch Q2 increase with reduced battery voltages. Typical drain-to-source "on" resistances $R_{DS(on)}$ for a p-MOSFET switch are illustrated in FIG. 2 for different gate-to-source voltages $V_{GS}$ as a function of drain currents $I_D$.

As shown in FIG. 2, the drain-to-source "on" resistance $R_{DS(on)}$ increases significantly as the magnitude of the gate-to-source voltage is reduced. For example, at a drain current $I_D$ of −1 A, $R_{DS(on)}$ increases from approximately a normalized 1 unit of resistance when $V_{GS}$ is −4.5 V to approximately a normalized 1.75 units of resistance when $V_{GS}$ is −3.5 V. A normalized resistance of 1 unit may be 120 Mohn, for example, in which case a normalized resistance of 1.75 units is equal to 210 mohm. The switch may thus operate with a higher "on" resistance when used in radiotelephones powered by lower voltage batteries, and the "on" resistance will increase further as the battery discharges, so that radiotelephone performance is further decreased.

The increased switch "on" resistance compounds the difficulty of providing sufficient drain current through the power amplifier to maintain a desired radiofrequency (RF) output power. The increased switch "on" resistance also increases power loss between the battery and the PA drain, thereby reducing battery life and increasing heat generation. Furthermore, the use of lower voltage batteries generally requires higher drain currents $I_D$ to maintain a sufficient RF output power from the power amplifier, while an increased on resistance tends to reduce the PA drain voltage thus requiring higher drain current to maintain PA power output. For example, a 3 V battery may be insufficient to adequately enable the switch Q1 of FIG. 1 to obtain sufficient RF output power from the power amplifier. Accordingly, it may be difficult to maintain adequate power amplifier performance with lower voltage batteries. While MOSFET switches with lower "on" resistances may be available, these lower on resistance switches may increase the cost of the radiotelphone.

SUMMARY OF THE INVENTION

It is therefore an object of the present invention to provide radio devices having improved performance.

It is another object of the present invention to provide improved control circuits for radio power amplifiers.

It is still another object of the present invention to provide power amplifier control circuits which can improve power amplifier reliability.

These and other objects are provided according to the present invention by a radio including a power amplifier which is isolated from the positive battery voltage by a switch wherein the switch is activated in response to a transmit activation signal when a negative bias voltage is applied to the power amplifier. A lockout circuit, however, prevents activation of the switch when the negative bias voltage is not coupled to the power amplifier. By preventing activation of the switch when the negative bias voltage is not coupled to the power amplifier, damage to the power amplifier can be reduced. In addition, the switch can be activated by coupling the negative bias voltage to the control gate. The "on" resistance of the switch (which can be a p-MOSFET switch) can thus be reduced.

According to an aspect of the present invention, a radio device includes a transmitter and a control circuit. The transmitter transmits radio communications, and the transmitter includes a power amplifier which generates an amplified radiofrequency output signal. In addition, the power amplifier uses both a positive supply voltage, such as a positive battery voltage, and a negative bias voltage for operation wherein the negative bias voltage is less than a supply ground voltage, such as a battery ground voltage. The control circuit enables the power amplifier during transmission, and the control circuit includes a switch coupled in series between the positive supply voltage and the power amplifier. This switch is activated in response to a transmit activation signal when the negative bias voltage is coupled to the power amplifier, and activation of the switch in response to the transmit activation signal is prevented when the negative bias voltage is not coupled to the power amplifier. By preventing or locking out activation of the switch when the negative bias voltage is not coupled to the power amplifier, the risk of damaging or destroying the power amplifier can be reduced.

The switch can include a control gate wherein the switch is activated in response to the transmit activation signal by coupling a negative voltage with respect to the supply ground voltage, such as the negative bias voltage, to the control gate and wherein the switch is deactivated in the absence of the transmit activation signal by applying the positive supply voltage to the control gate. Accordingly, the "on" resistance of the activated switch (which can be a p-MOSFET) can be reduced thereby improving the performance of the power amplifier, facilitating the use of lower voltage batteries, and reducing power comsumption. Moreover, the power amplifier can be a depletion mode GaAs FET power amplifier.

The switch can include a control gate, and the control circuit can include a pull-up resistance and first and second pull-down transistors. The pull-up resistance is coupled between the control gate and the positive supply voltage, and the first and second pull-down transistors are coupled in series between the control gate and a pull-down node. More particularly, the first transistor turns on responsive to the transmit activation signal and the second pull-down transistor is prevented from turning on when the negative bias voltage is not coupled to the power amplifier. Furthermore, the negative bias voltage can be coupled to the pull-down node when the negative bias voltage is coupled to the power amplifier.

The second pull-down transistor can include a control electrode electrically coupled to the supply ground voltage so that the second pull-down transistor is prevented from turning on when the negative bias voltage is not coupled to the activation node. A pull-down resistance can also be coupled between the pull-down node and the supply ground voltage so that the pull-down node is maintained at the supply ground voltage when the negative bias voltage is not applied to the power amplifier.

The control circuit can also include a detection circuit and a logic circuit. The detection circuit generates a negative bias voltage signal when the negative bias voltage is coupled to the power amplifier, and the logic circuit activates the switch only when both the negative bias voltage signal and the transmit activation signal are present thereby preventing the switch from being activated when the negative bias voltage is not coupled to the power amplifier.

The circuits and methods of the present invention can thus reduce the likelihood of damaging or destroying a transmitter power amplifier by preventing coupling between the power amplifier and the positive supply voltage when the negative bias voltage is not coupled to the power amplifier. The circuits and methods of the present invention can also reduce the "on" resistance of the switch between the power amplifier and the positive battery voltage by using the negative bias voltage to activate the switch. Improved power amplifier performance with lower voltage batteries can thus be obtained.

BRIEF DESCRIPTION OF THE DRAWINGS

FIG. 4 is a graph illustrating modeled switch Q11 gate voltages as a function of the negative bias voltage for the control circuit of FIG. 3 when the transistor Q12 is turned on.

FIG. 5 is a graph illustrating modeled switch Q11 drain currents as a function of the negative bias voltage for the control circuit of FIG. 3 when the transistor Q12 is turned on.

FIG. 10 is a graph illustrating modeled switch Q11 gate voltages as a function of the negative bias voltage for the control circuit of FIG. 9 when the transistor Q12 is turned on.

FIG. 11 is a graph illustrating modeled switch Q11 drain currents as a function of the negative bias voltage for the control circuit of FIG. 9 when the transistor Q12 is turned on.

DETAILED DESCRIPTION

The present invention will now be described more fully hereinafter with reference to the accompanying drawings in which a preferred embodiment of the invention is shown. The present invention may, however, be embodied in many different forms and should not be construed as limited to the embodiment set forth herein; rather, this embodiment is provided so that this disclosure will be thorough and complete, and will fully convey the scope of the invention to those skilled in the art.

As discussed in the Background of the Invention, a depletion mode n-channel GaAs FET power amplifier may be damaged or destroyed if the positive battery voltage $+V_{BAT}$ is coupled thereto when the negative bias voltage is not coupled to the power amplifier. Accordingly, a power amplifier control circuit for a cellular radiotelephone according to the present invention can include hardware lockout features to prevent the coupling of the positive battery voltage $+V_{BAT}$ to the power amplifier when the negative bias voltage is not coupled to the power amplifier. In addition, a power amplifier control circuit according to the present invention can include an isolation switch between the power amplifier and the positive battery voltage $+V_{BAT}$ wherein the switch is turned on using the negative bias voltage thereby reducing the "on" resistance of the switch. The voltage drop across the switch and the power consumed by the switch can thus be reduced thereby improving the performance of the power amplifier.

Figure 3:
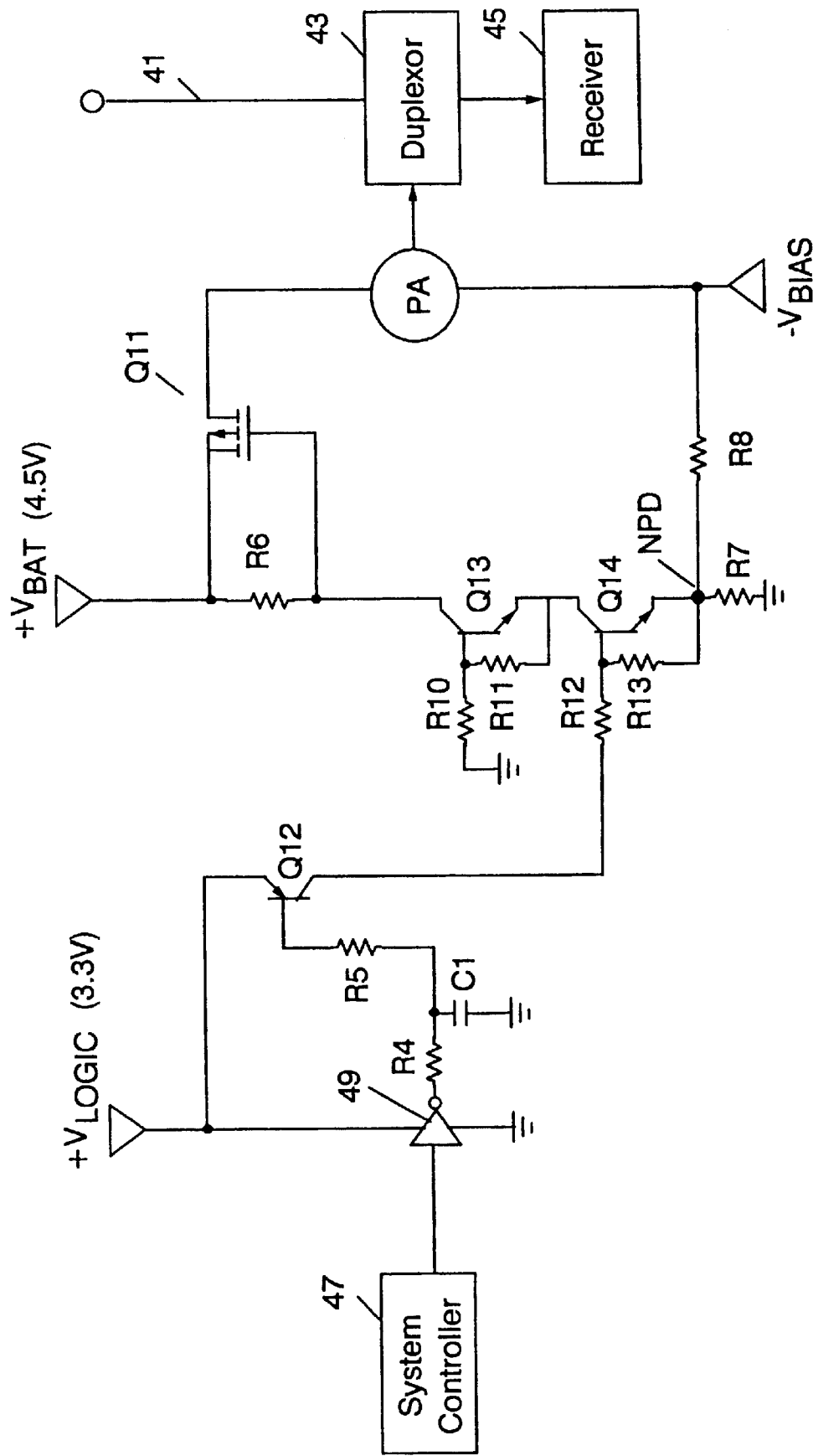
FIG. 3 is a schematic diagram illustrating a first power amplifier control circuit for a radiotelephone according to the present invention.

A first radiotelephone including a power amplifier control circuit according to the present invention is illustrated in FIG. 3. In particular, the radiotelephone includes a transmitter including a power amplifier PA which generates amplified radiofrequency transmit signals when the radiotelephone is transmitting, and these amplified radiofrequency transmit signals are provided to the duplexor 43 for transmission from antenna 41. The duplexor 43 also provides radiofrequency receive signals from the antenna 41 to the receiver 45, while separating the transmit and receive paths. The operation of the power amplifier, duplexor, receiver, and antenna will be understood by those having skill in the art and will thus not be discussed further.

As shown, the power amplifier is coupled to the positive battery voltage $+V_{BAT}$ through the switch Q11 which can be a p-MOSFET switch such as a NDS356P produced by National Semiconductor, and the switch Q11 is preferably implemented as a discrete transistor to facilitate heat dissipation. The power amplifier is also coupled with the negative bias voltage which is less than a ground voltage of the radiotelephone battery. As discussed above, the switch Q11 isolates the power amplifier from the positive battery voltage $+V_{BAT}$ when the negative voltage bias is not applied to the power amplifier, thereby reducing the likelihood that the power amplifier will be damaged or destroyed.

In addition, the system controller 47, which can include an application specific integrated circuit (ASIC), a standard processor, discrete logic, or combinations thereof, controls the radiotelephone according to system firmware and/or software. More particularly, the system controller 47 generates an active high transmit activation signal to trigger the switch Q11 to turn on during transmit operations. The lockout circuit, including transistors Q13 and Q14, however, prevents the switch Q11 from turning on in response to the transmit activation signal when the negative bias voltage is not coupled to the power amplifier. The likelihood that the switch Q11 is turned on when the negative bias voltage is not coupled to the power amplifier as a result of firmware and/or software bugs or mis-operations due to transients can thus be reduced, thereby reducing the likelihood that the power amplifier will be damaged or destroyed.

In particular, inverter 49 (such as a 74HC04 inverter) and transistor Q12 can be used to buffer the system controller 47, and to shift the level of the transmit activation signal from a 0 v to $+V_{LOGIC}$ (3.3 V) signal level to a $-V_{BIAS}$ to $+V_{LOGIC}$ signal level. The transistor Q12 can be a UMB3N produced by Rohm. The resistor R4 (0.1 ohm) and the capacitor C1 (0.1 pF) are used to model the impedance characteristics of the line between the inverter 49 and the resistor R5, and the resistor R5 (2.2 kohm) limits current into the base of the transistor Q12. As will be understood by those having skill in the art, the inverter 49, the resistor R5, and the transistor Q12 can be implemented discretely, or as part of the system controller, or combinations thereof. Accordingly, the output of the transistor Q12 is the level shifted equivalent of the transmit activation signal generated by the system controller 47, and the output of the transistor Q12 is provided to the transistor Q14.

The gate of the p-MOSFET switch Q11 is coupled to the positive battery voltage $+V_{BAT}$ through the pull-up resistor R6 (33 kohm), and the gate is coupled to the pull-down node NPD through the pull-down transistors Q13 and Q14. Furthermore, the pull-down node NPD is coupled to the battery ground voltage through the relatively high resistance pull-down resistor R7 (10 Mohm) and coupled to the negative bias voltage input to the power amplifier through the relatively low resistance pull-down resistor R8 (20 ohm). Furthermore, the pull-down node (NPD) will be pulled down to the negative bias voltage if the negative bias voltage is applied to the negative bias voltage input of the power amplifier.

If either or both of the pull-down transistors are turned off, the gate of p-MOSFET switch Q11 is pulled up to the positive battery voltage $+V_{BAT}$ so that the switch Q11 is turned off. The gate of switch Q11 will only be coupled to the pull-down node if both pull-down transistors Q13 and Q14 are turned on. As shown, the transistor Q14 will be turned on if the level shifted transmit activation signal is generated by the transistor Q12 and applied to the base of the transistor Q14. Because the base of the pull-down transistor Q13 is coupled to the battery ground voltage, the transistor Q13 will only be turned on if transistor Q14 is turned on and the negative bias voltage is coupled to the power amplifier so that the pull-down node NPD is pulled to the negative bias voltage. If the transistor Q14 is turned on, but the negative bias voltage is not applied to the power amplifier input, the pull-down node will be coupled to the battery ground voltage so that the base voltage of transistor Q13 is equal to the emitter voltage of transistor Q13, and transistor Q13 will not turn on. Accordingly, the gate of switch Q11 will remain pulled-up to the positive battery voltage $+V_{BAT}$ when the negative bias voltage is not applied to the power amplifier even though a transmit activation signal has been generated, so that the power amplifier will be isolated from the positive battery voltage $+V_{BAT}$. The likelihood of damaging or destroying the power amplifier can thus be reduced. For the purposes of this disclosure, the positive battery voltage coupled to the gate of switch Q11 is defined to include the positive battery voltage $+V_{BAT}$ less any voltage losses across the resistor R6 or any other components therebetween.

The switch Q11 is thus turned on when the negative bias voltage (which can be approximately −4 V) is applied to the power amplifier, and the system controller generates the transmit enable signal. In particular, the inverter 49 generates a logic low signal responsive to the transmit enable signal thereby saturating the transistor Q12. The transistor Q14 is thus saturated because the base thereof is coupled to the positive logic voltage through the resistor R12 and the saturated transistor Q12. Accordingly, the collector voltage of transistor Q14 (which is the same as the emitter voltage of the transistor Q13) during saturation will be approximately 0–200 mV ($Q13V_{CE}SAT$) greater than the voltage of the pull-down node NPD (the negative bias voltage when the negative bias voltage is applied to the power amplifier).

Figure 1:
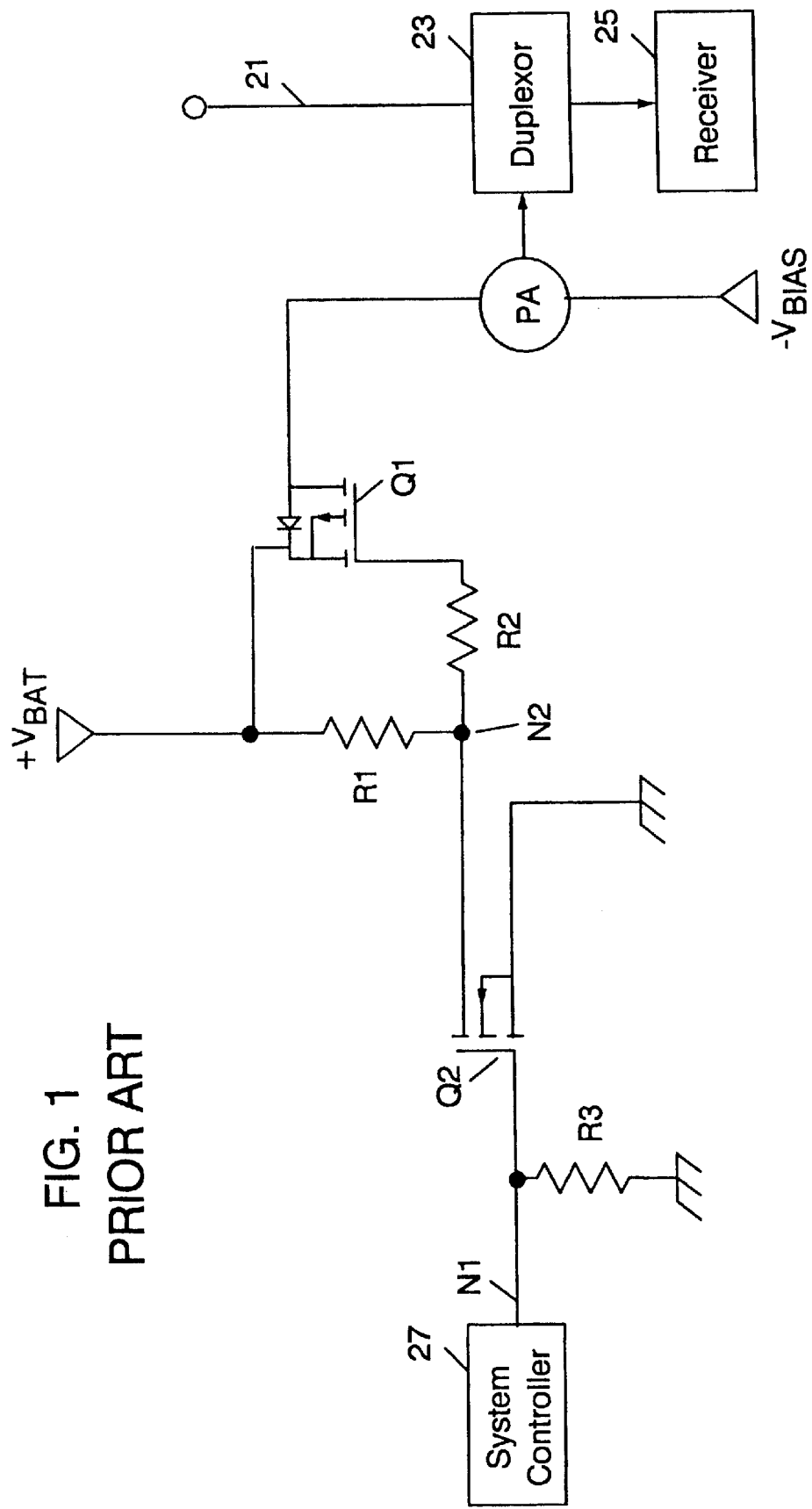
FIG. 1 is a schematic diagram illustrating a power amplifier control circuit for a radiotelephone according to the prior art.
Figure 2:
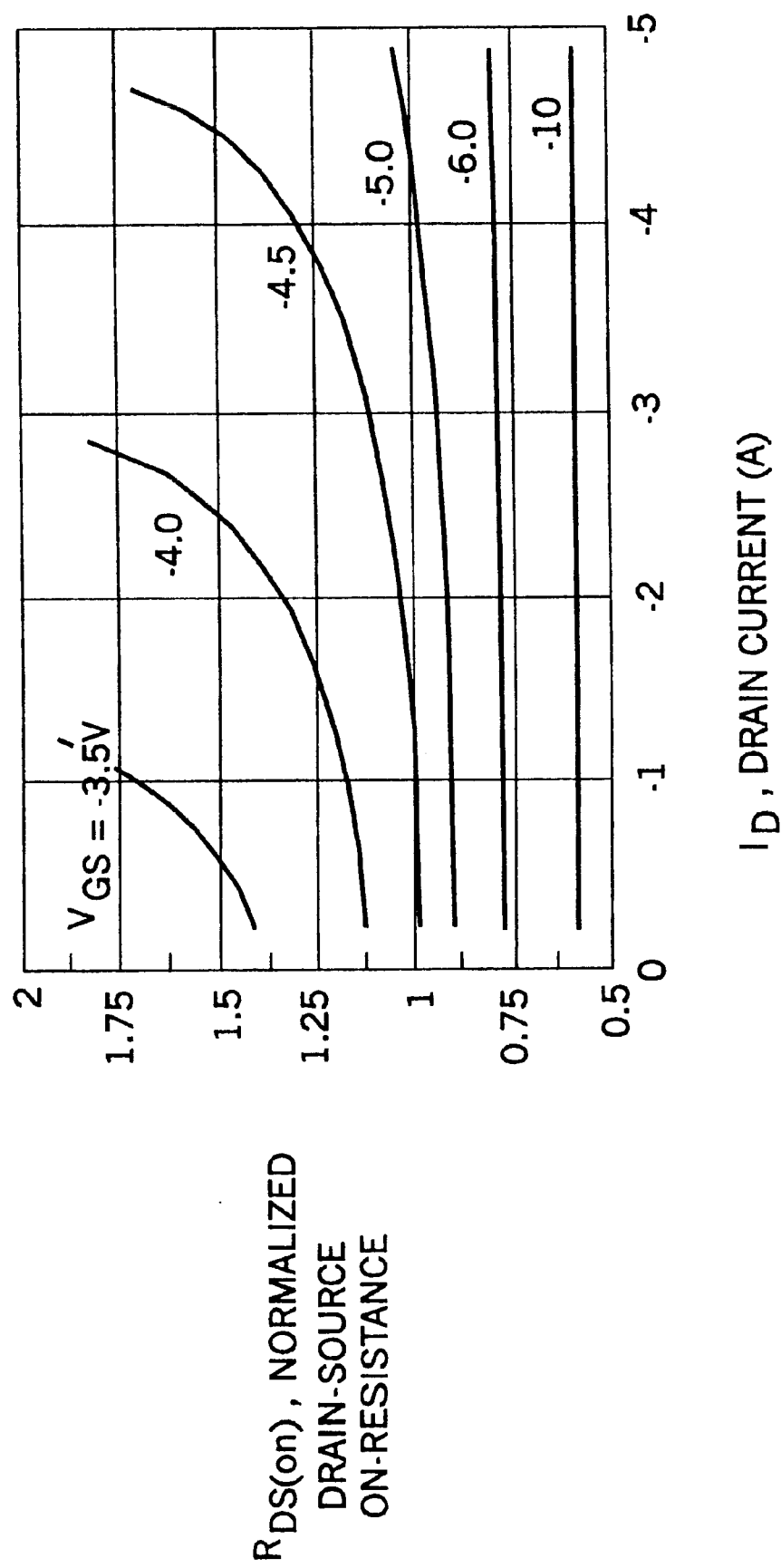
FIG. 2 is a graph illustrating typical normalized "on" resistances as a function of drain current for the switch Q1 of FIG. 1 for different gate to source voltages.

Because the emitter of the transistor Q13 is pulled down to approximately the negative bias voltage and the base of the transistor Q13 is coupled to the battery ground voltage, a positive voltage (approximately equal to the bias voltage) is generated across the resistor R10 and the base emitter junction of transistor Q13 thereby saturating transistor Q13. The collector voltage of the transistor Q13 is thus pulled down to approximately 0–400 mV higher ($Q13V_{CE}SAT+Q14V_{CE}SAT$) than the negative bias voltage. Because the control gate of the switch Q11 is coupled to the collector of transistor Q13, the voltage of the control gate of switch Q11 is pulled down to approximately the negative bias voltage thereby turning the switch Q11 on and providing the positive battery voltage $+V_{BAT}$ to the power amplifier PA. The gate drive characteristics of the switch Q11 are thus improved over that of the prior art because the magnitude of the gate to source voltage is increased from $-V_{BAT}$ ($0-V_{BAT}$ in the prior art circuit of FIG. 1) to $-V_{BAT}-3.5$ V ($-V_{BIAS}+Q13V_{CE}SAT+Q14V_{CE}SAT-V_{BAT}$ in the circuit of FIG. 3 according to the present invention). In other words, the gate is pulled down to the negative bias voltage less the collector to emitter saturation voltages of transistors Q13 and Q14. For the purposes of this disclosure, the negative bias voltage applied to the gate of switch Q11 is defined to include the negative bias voltage $V_{BIAS}$ less any voltage losses across transistors Q13 and Q14, resistor R8, or any other components therebetween.

In summary, the transistors Q13 and Q14 perform a logic AND function so that the transmit activation signal must be generated and the negative bias voltage $-V_{BIAS}$ must be coupled to the power amplifier before the switch Q11 is turned on. In addition, the gate drive signal for the switch Q11 is improved thereby reducing the "on" resistance of the switch Q11. Accordingly, the control circuit of the present invention can provide improved performance when using lower voltage batteries.

As discussed above, the system controller 47 can be implemented as one or more application specific integrated circuits, standard processors, other integrated and/or discrete circuits, or combinations thereof. The level shifting circuit including inverter 49, resistor R5, and transistor Q12 can be implemented discretely, as a portion of the system processor or other integrated circuits, or portions can be implemented discretely and other portions implemented as portions of the system processor or other integrated circuits. Furthermore, the transistors Q13 and Q14 and the resistor R8 can also be implemented discretely or as a portion of one or more ASICs or standard processors or other integrated circuits. In particular, the transistors Q13 and Q14 can be efficiently provided using a UMH10N integrated circuit produced by Rohm. This integrated circuit efficiently provides both transistors Q13 and Q14 as well as resistors R10 (2.2 kohm), R11 (47 kohm), R12 (2.2 kohm), and R13 (47 kohm).

FIGS. 4–8 are graphs illustrating modeled operations of the control circuit of FIG. 3. In particular, FIG. 4 illustates the gate voltage of the switch Q11 as a function of the negative bias voltage $-V_{BIAS}$ when the transistor Q12 is turned on (i.e. the transmit activation signal is provided by the system controller at 3 V) with the positive battery voltage $+V_{BAT}$ equal to 4.5 V and the logic voltage equal to 3.3 V. As shown, the switch Q11 is completely disabled for negative bias voltages greater than −0.5 V.

Figure 5:
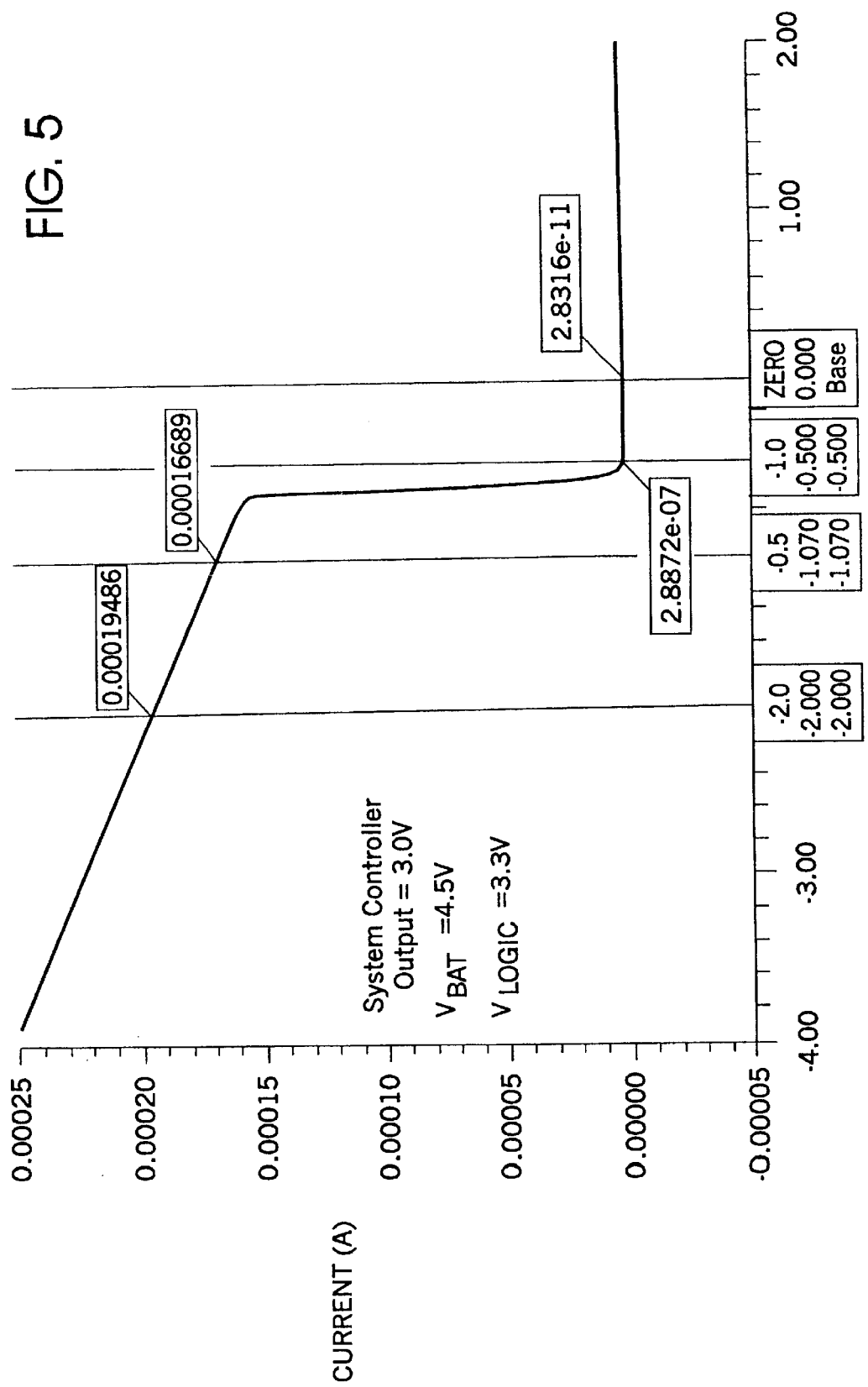

FIG. 5 illustrates the collector current for the transistor Q13 as a function of the negative bias voltage $-V_{BIAS}$ when the transistor Q12 is turned on (i.e. the transmit activation signal is provided by the system controller at 3 V) with the positive battery voltage $+V_{BAT}$ equal to 4.5 V and the logic voltage equal to 3.3 V. As shown, the collector current for the transistor Q13 is 0 for negative bias voltages greater than −0.5 V. The control circuit is thus disabled (or locked out) for negative bias voltages greater than −0.5 V.

Figure 6:
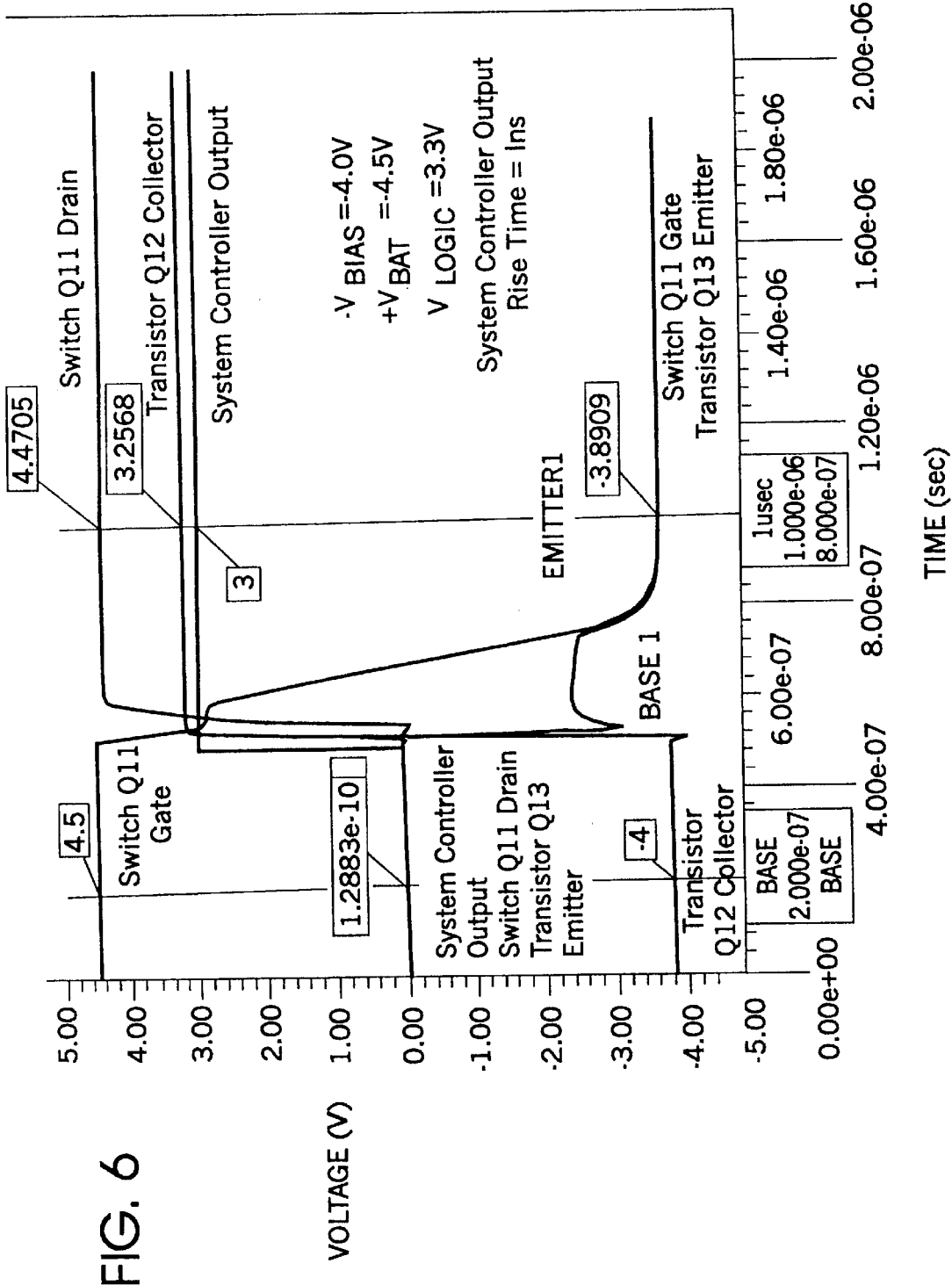
FIG. 6 is a graph illustrating modeled transient (or time domain) operations of the control circuit of FIG. 3 when the transmit activation signal is enabled and the negative bias voltage is provided.

FIG. 6 illustrates modeled transient operations of the control circuit of FIG. 3 when the transmit activation signal is enabled from 0 V to 3 V and a negative bias voltage $-V_{BIAS}$ of 4.0 V is provided to the power amplifier PA. As shown, the gate of switch Q11 falls from the positive battery voltage $+V_{BAT}$ to approximately the negative bias voltage $-V_{BIAS}$, and the drain voltage of the switch Q11 increases from 0 V to approximately the positive battery voltage $+V_{BAT}$ so that approximately the positive battery voltage $+V_{BAT}$ is provided to the power amplifier PA.

Figure 7:
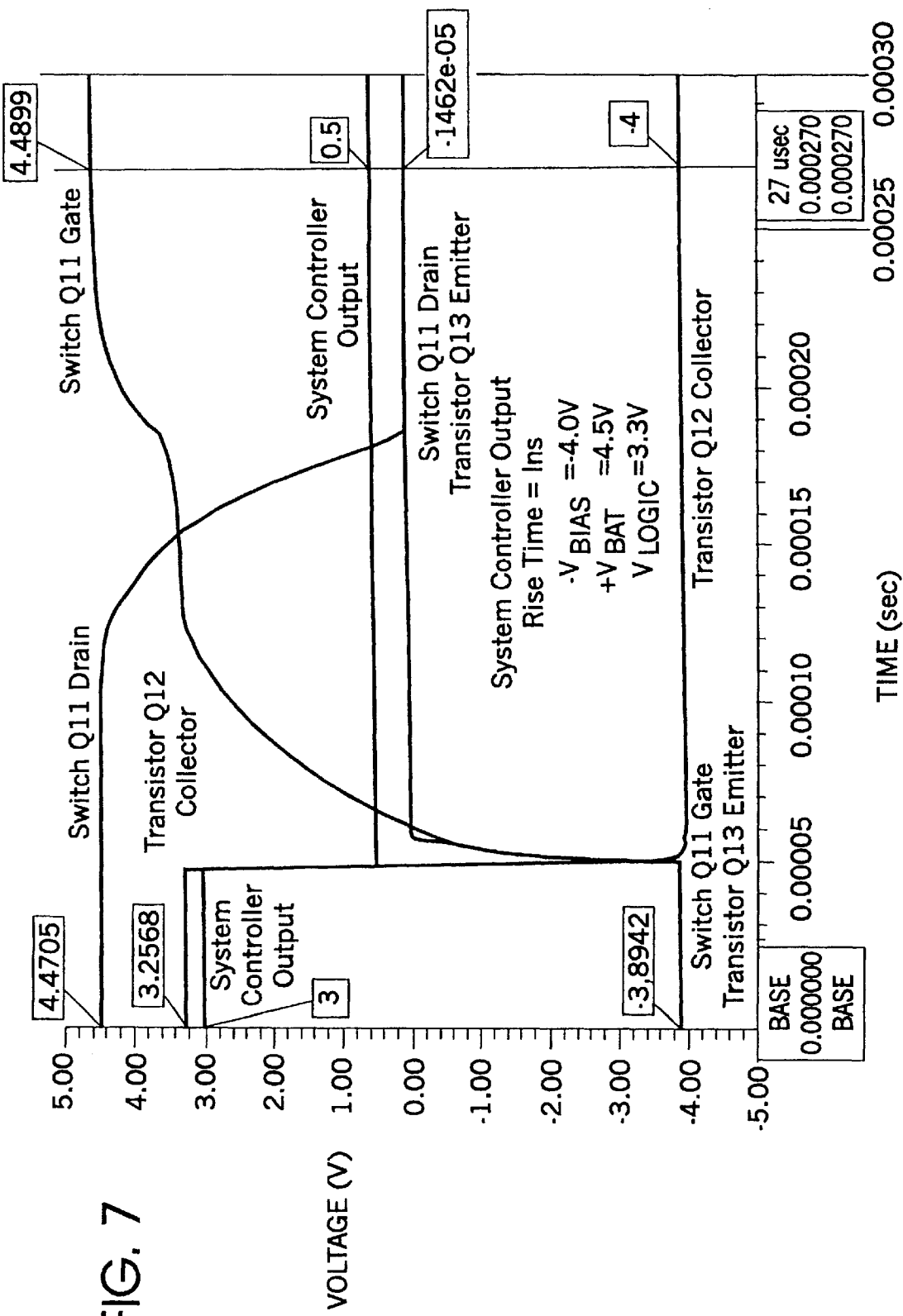
FIG. 7 is a graph illustrating modeled transient (or time domain) operations of the control circuit of FIG. 3 when the transmit activation signal is disabled and the negative bias voltage is provided.

FIG. 7 illustrates modeled operations of the control circuit of FIG. 3 when the transmit activation signal is disabled from 3 V to 0.5 V and a negative bias voltage $-V_{BIAS}$ of −4.0 is coupled to the power amplifier PA. As shown, the gate of the switch Q11 rises from approximately the negative bias voltage $-V_{BIAS}$ to approximately the positive battery voltage $+V_{BAT}$, and the drain voltage of the switch Q11 falls from approximately the positive battery voltage $+V_{BAT}$ to approximately the battery ground voltage.

Figure 8:
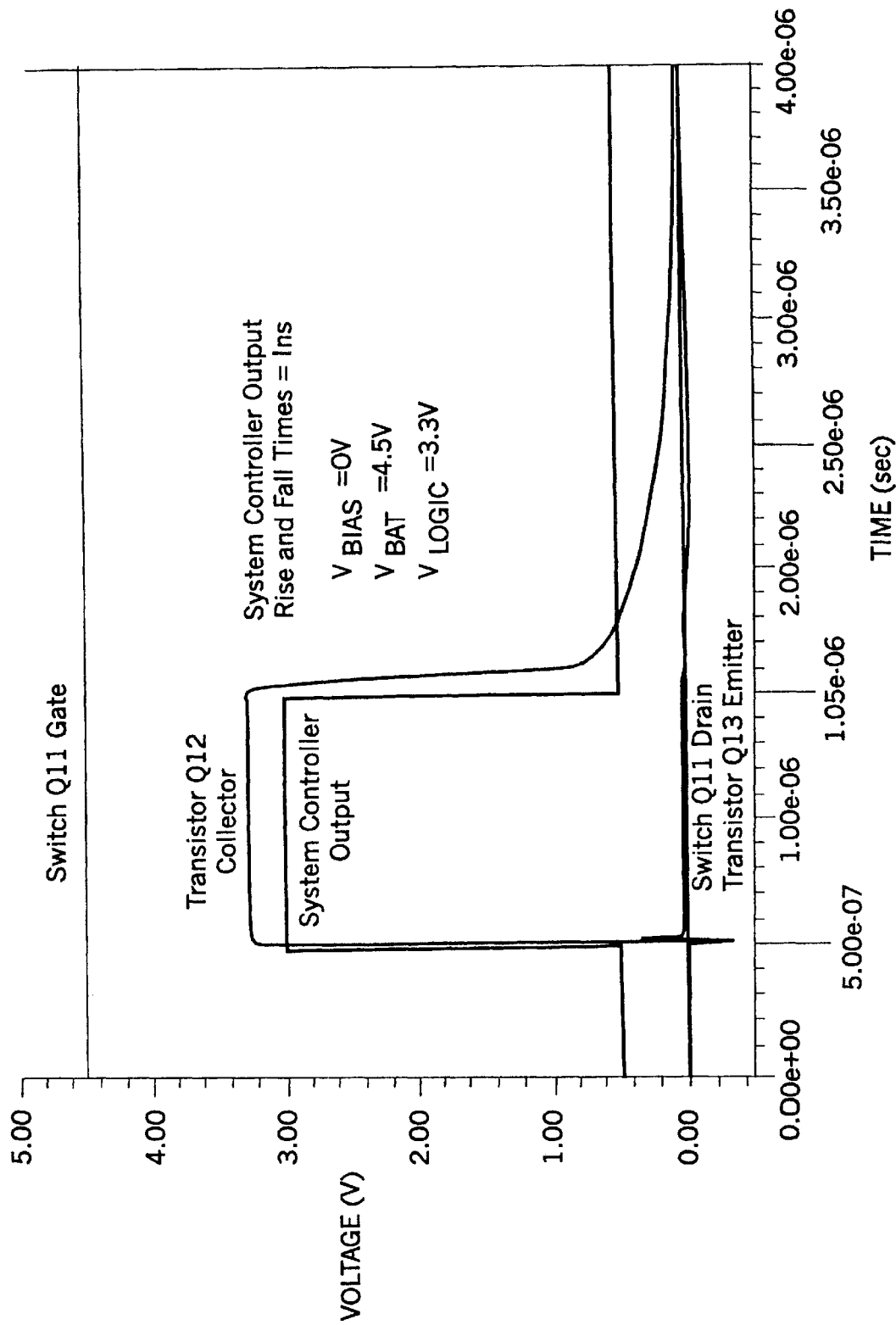
FIG. 8 is a graph illustrating modeled transient (or time domain) operations of the control circuit of FIG. 3 when the negative bias voltage is not provided.

FIG. 8 illustrates modeled operations of the control circuit of FIG. 3 when the negative bias voltage $-V_{BIAS}$ of 4.0 V is not coupled to the power amplifier so that the pull down node NPD is pulled to the battery ground voltage 0 V. As shown, the system controller output transitions from 0.5 V to 3.0 V and back to 0.5 V. In response, the collector of transistor Q12 transitions from 0 V to 3.3 V and back to 0 V. The emitter of transistor Q13, however remains at 0 V so that the gate of switch Q11 remains pulled up to approximately the positive battery voltage $+V_{BAT}$. Accordingly, the switch Q11 remains turned off so that the power amplifier PA is isolated from the positive battery voltage $+V_{BAT}$.

Figure 9:
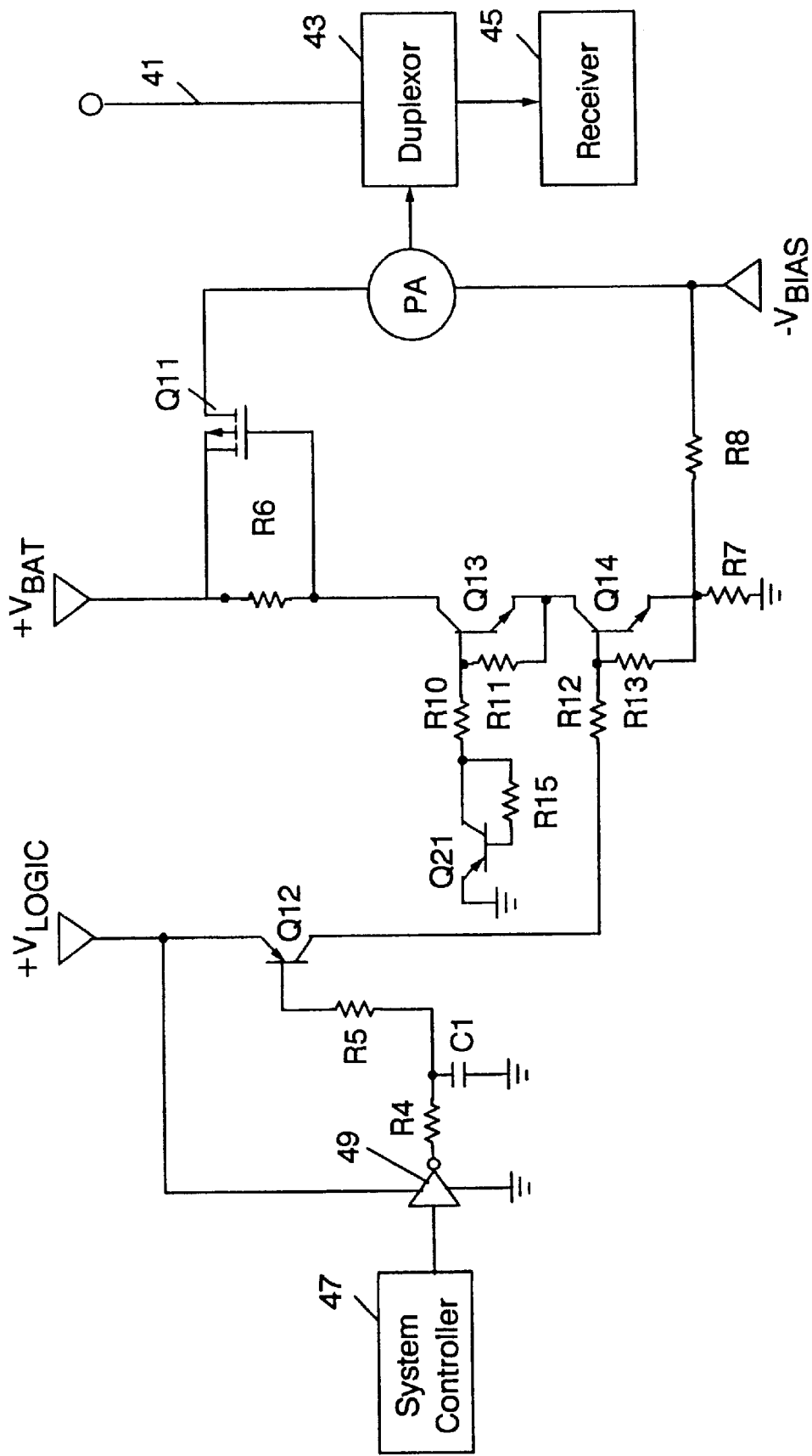
FIG. 9 is a schematic diagram illustrating a second power amplifier control circuit for a radiotelephone according to the present invention.

A second power amplifier control circuit according to the present invention is illustrated in FIG. 9. The control circuit is the same as that illustrated in FIG. 3 with the addition of the transistor Q21 and the resistor R15 (2.2 kohm). In particular, the transistor Q21 and the resistor R15 are arranged to provide diode operation between the battery ground voltage and the voltage divider including resistors R10 and R11. This diode effectively lowers the voltage required at the pull-down node NPD to turn transistor Q13 on as will be discussed with reference to FIGS. 10 and 11.

Figure 10:
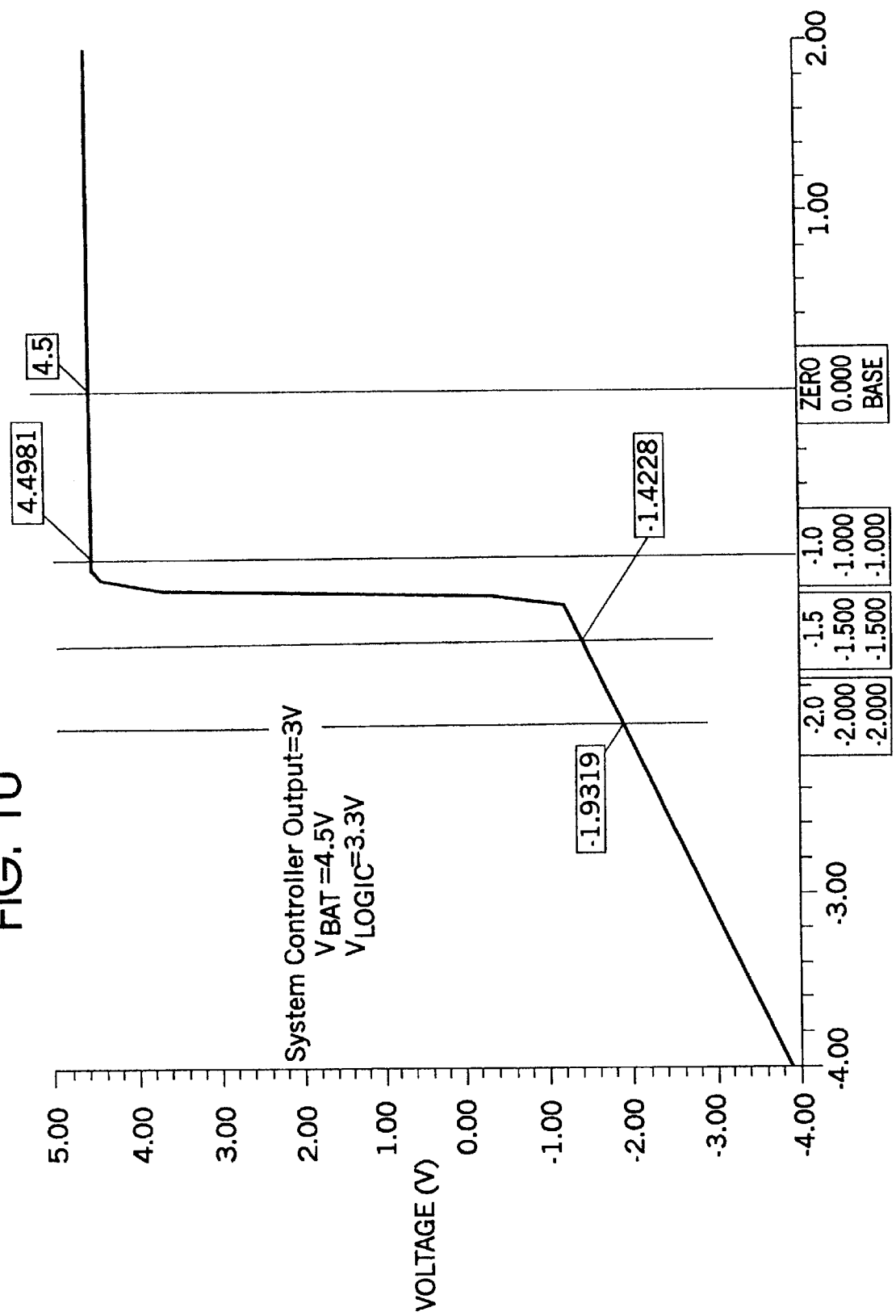

As shown in FIG. 10, when the transmit activation signal is provided so that the system controller output is equal to 3.0 V and the transistor Q12 is saturated in the circuit of FIG.

Figure 4:
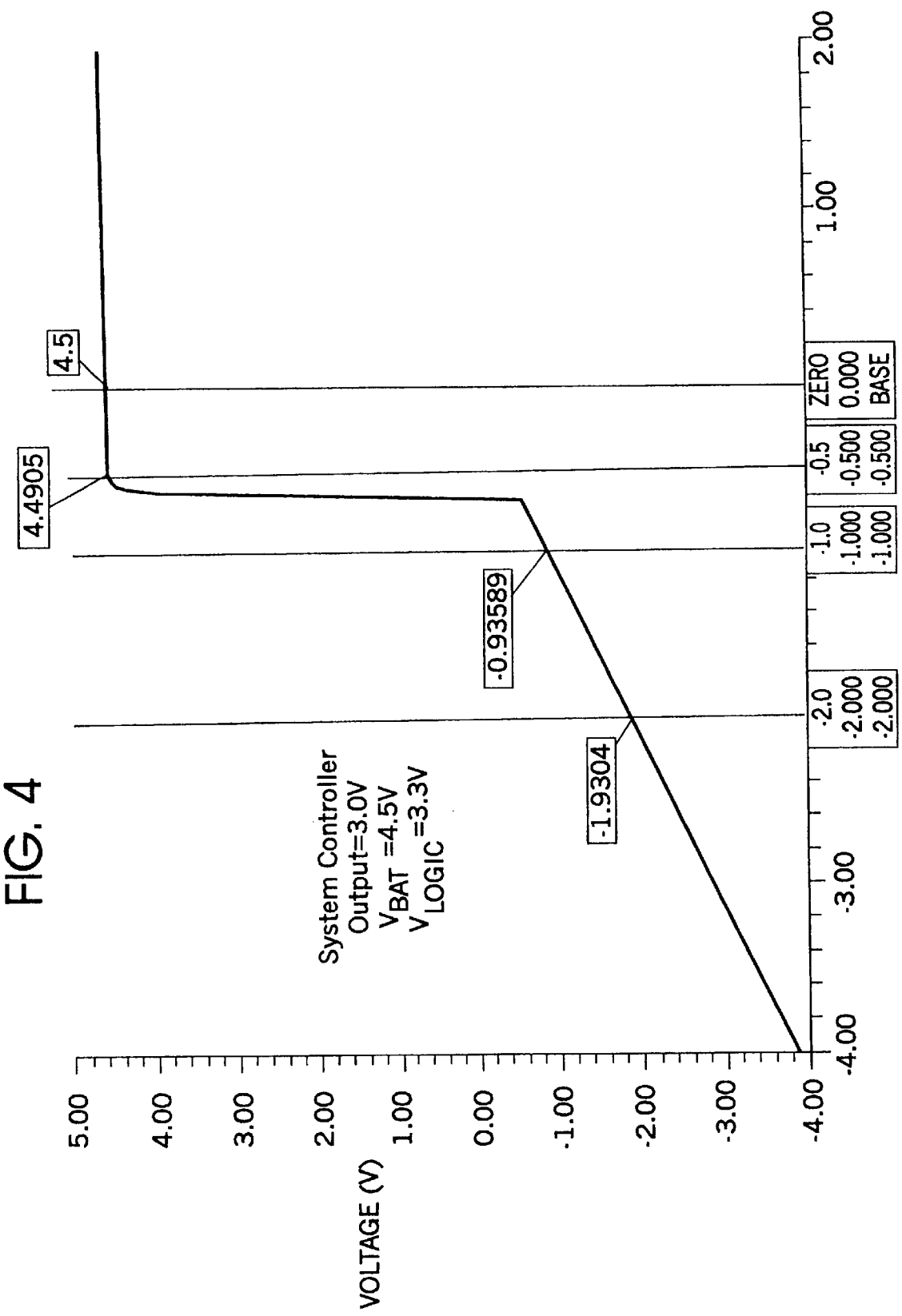
Figure 11:
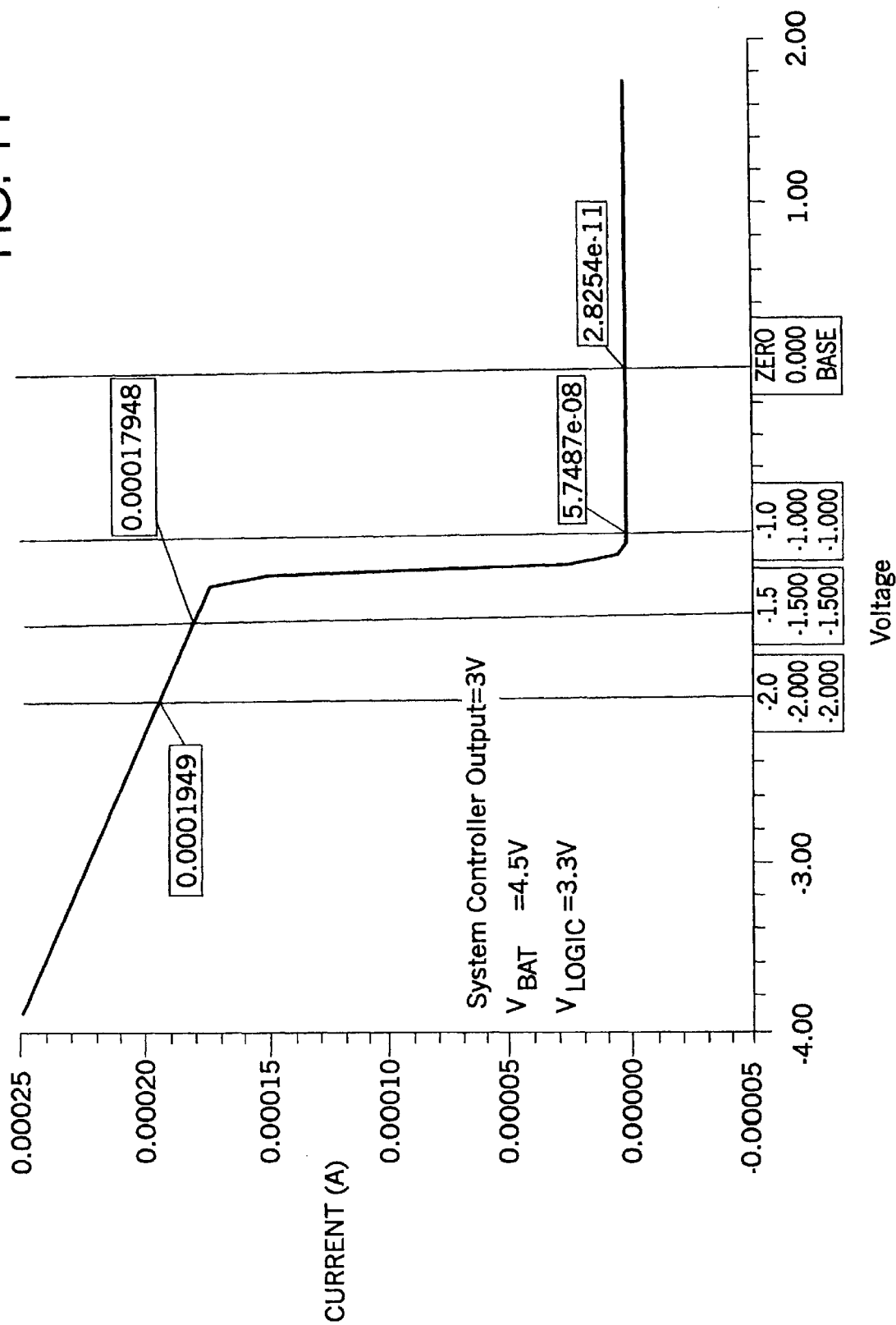

9, the voltage at the gate of the switch Q11 is approximately equal to the positive battery voltage $+V_{BAT}$ for voltages at the node NPD greater than −1.0 V. Accordingly, the switch Q11 will be disabled for negative bias voltages greater than approximately −1.0 V. This compares to the −0.5 V threshold for the circuit of FIG. 3 as shown in FIG. 4. The threshold can thus be increased by adding the diode of FIG. 9. Furthermore, the transistor Q21, the resistor R15, the transistor Q12, and the resistor R5 can be provided on a common integrated circuit device such as UMB3N produced by Rohm so that the part count is not increased. FIG. 11 shows that the drain current for switch Q11 is approximately 0 when the voltage at the node NPD is greater than −1.0 V for the conditions set forth with regard to FIG. 10.

Figure 12:
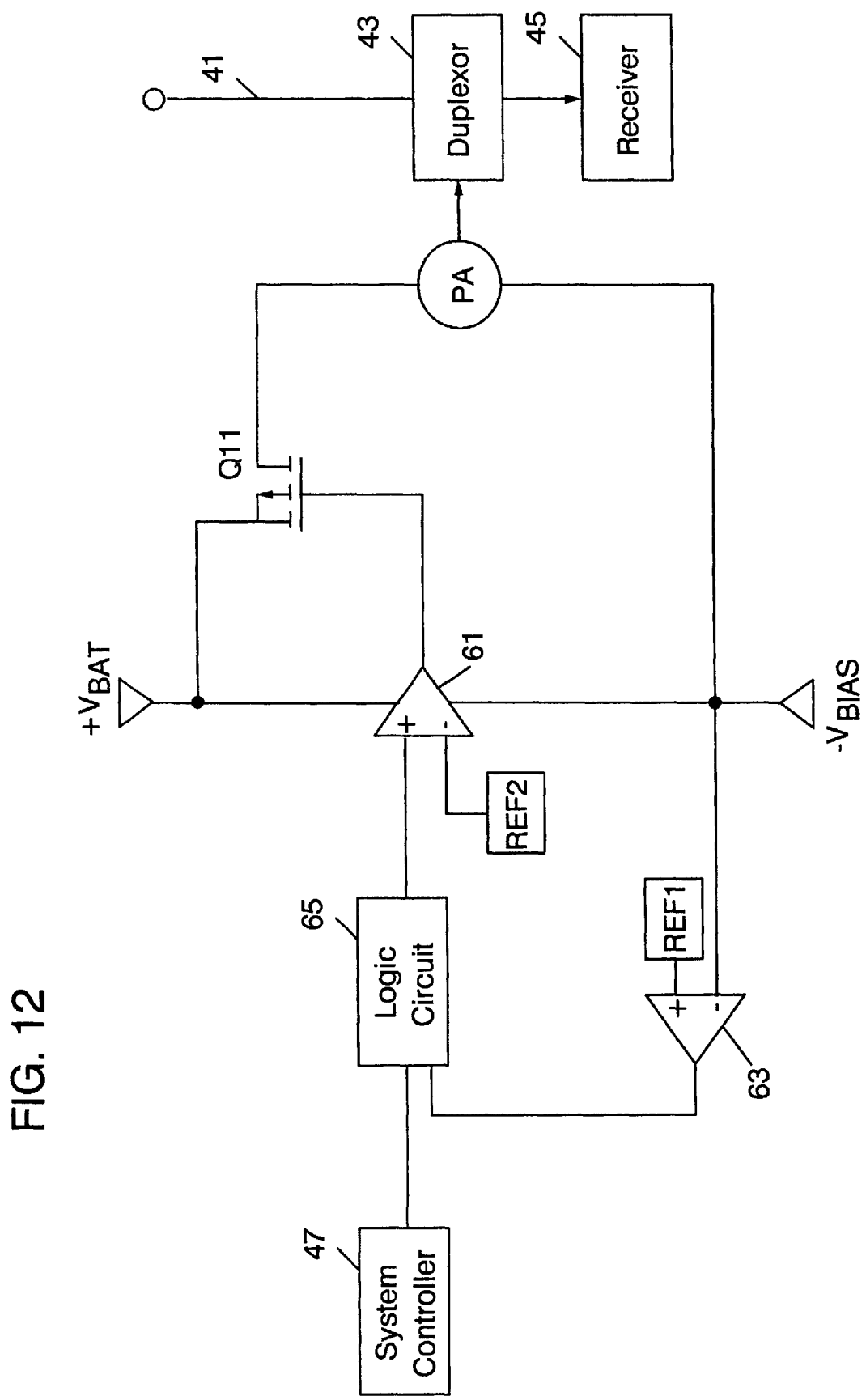
FIG. 12 is a schematic diagram illustrating a third power amplifier control circuit for a radiotelephone according to the present invention.

FIG. 12 illustrates a radiotelephone including a third power amplifier control circuit according to the present invention. This radiotelephone includes a system controller 47, a switch Q11, a power amplifier PA, an antenna 41, an duplexor 43, and a receiver 45 as discussed above. In this circuit, however, a pair of operational amplifiers 61 and 63 are used to detect the presence of the negative bias voltage $-V_{BIAS}$ and to prevent the switch Q11 from turning on in the absence of the negative bias voltage $-V_{BIAS}$. The use of the operational amplifier 61 also provides that the gate of the switch Q11 is switched between the positive battery voltage $+V_{BAT}$ and the negative bias voltage $-V_{BIAS}$.

In particular, the operational amplifier 63 compares the voltage at the negative bias voltage $-V_{BIAS}$ input with a first reference voltage Ref1 to determine if the negative bias voltage $-V_{BIAS}$ is being coupled to the power amplifier PA. The reference voltage Ref1 can be provided using a voltage divider or other means known to those having skill in the art, and the reference voltage Ref1 preferably has a value between the battery ground voltage and the negative reference voltage. The operational amplifier 63 thus generates an enabling signal when a negative bias voltage $-V_{BIAS}$ less than the reference voltage Ref1 is coupled to the power amplifier PA. Alternately, the operational amplifier 63 generates a disabling signal when a negative bias voltage $-V_{BIAS}$ greater than the reference voltage Ref1 is coupled to the power amplifier PA.

A logic circuit 65 is used to combine the system controller output with the output of the operational amplifier 63 so that the enabling signal from the operational amplifier 63 and the transmit activation signal from the system controller 47 are both required to turn on the switch Q11. For example, the logic circuit 47 can include an AND gate and/or other logic gates such as NAND, OR, NOR, XOR, XNOR, Invertors, and/or combinations thereof. The logic circuit generates a gate enable signal to turn the switch Q11 on when the negative bias voltage $-V_{BIAS}$ is less than the reference voltage Ref1, and the logic circuit generates a gate disable signal if the transmit activation signal is not provided or if a sufficient negative bias voltage $-V_{BIAS}$ is not provided.

The operational amplifier 61 compares the output of the logic circuit 65 with the reference voltage Ref2 to generate a gate turn on voltage of approximately the negative bias voltage $-V_{BIAS}$ when the gate enable signal is generated and to generated a gate turn off voltage of approximately the positive battery voltage $+V_{BAT}$ when the gate disable signal is generated. The reference voltage Ref2 can be provided by a voltage divider or other means known to those having skill in the art, and the reference voltage Ref2 is preferably chosen to be between the voltages of the gate enable and disable signals. In effect, the operational amplifier 61 converts the logic circuit output signals to signals ranging from the positive battery voltage $+V_{BAT}$ to the negative bias voltage $-V_{BIAS}$ by feeding the positive and negative power inputs with the positive battery voltage $+V_{BAT}$ and the negative bias voltage $-V_{BIAS}$. The "on" resistance of the switch Q11 can thus be reduced because the gate to source voltage during turn on is approximately equal to the difference between the positive battery voltage $+V_{BAT}$ and the negative bias voltage $-V_{BIAS}$ as opposed to the difference between the positive battery voltage $+V_{BAT}$ and the battery ground voltage.

The system controller 47 can be implemented with one or more ASICs, standard processors, integrated circuits, discrete circuits, or combinations thereof as discussed above, and the switch Q11 can be implemented as a discrete device to facilitate heat dissipation. Furthermore, the operational amplifiers 61 and 63 and the logic circuit 65 can be implemented as one more ASICs, integrated circuits, discrete circuits or combinations thereof separate from the system controller or in combination with the system controller.

In the drawings and specification, there has been disclosed a typical preferred embodiment of the present invention and, although specific terms are employed, these terms are used in a generic and descriptive sense only and not for purposes of limitation, the scope of the invention being set forth in the following claims.

That which is claimed is:

1. A radio device comprising:
 a transmitter that transmits radio communications wherein said transmitter comprises a power amplifier that generates an amplified radiofrequency output signal wherein said power amplifier uses both a positive supply voltage and a negative bias voltage for operation wherein said negative bias voltage is less than a supply ground voltage and wherein said power amplifier receives the negative bias voltage at a negative bias voltage input; and
 a control circuit that enables said power amplifier during transmission, said control circuit comprising a switch coupled in series between the positive supply voltage and said power amplifier, said switch being activated in response to a transmit activation signal when the negative bias voltage is applied to said power amplifier, and wherein activation of said switch in response to the transmit activation signal is prevented when the negative bias voltage is not applied to said power amplifier wherein activation of said switch is prevented responsive to a feedback signal from said negative bias voltage input.

2. A radio device according to claim 1 wherein the radio device is battery powered, wherein the positive supply voltage is a positive battery voltage, and wherein the supply ground voltage is a battery ground voltage.

3. A radio device according to claim 1 wherein said switch comprises a control gate and wherein said switch is activated in response to the transmit activation signal by coupling a negative voltage with respect to the circuit ground voltage to said control gate and wherein said switch is deactivated in the absence of the transmit activation signal by coupling the positive supply voltage to said control gate wherein the radio device is battery powered, wherein the positive supply voltage is a positive battery voltage, and wherein the supply ground voltage is a battery ground voltage.

4. A radio device according to claim 3 wherein said switch is activated in response to the transmit activation signal by coupling the negative bias voltage to said control gate.

5. A radio device according to claim 1 wherein said power amplifier comprises a depletion mode GaAs FET power amplifier.

6. A radio device comprising:
- a transmitter that transmits radio communications wherein said transmitter comprises a power amplifier that generates an amplified radiofrequency output signal wherein said power amplifier uses both a positive supply voltage and a negative bias voltage for operation wherein said negative bias voltage is less than a supply ground voltage; and
- a control circuit that enables said power amplifier during transmission, said control circuit comprising a switch coupled in series between the positive supply voltage and said power amplifier, said switch being activated in response to a transmit activation signal when the negative bias voltage is applied to said power amplifier, and wherein activation of said switch in response to the transmit activation signal is prevented when the negative bias voltage is not applied to said power amplifier;
- wherein said switch comprises a control gate and wherein said control circuit further comprises:
  - a pull-up resistance coupled between said control gate and the positive supply voltage; and
  - first and second pull-down transistors coupled in series between said control gate and a pull-down node wherein said first transistor turns on responsive to said transmit activation signal and wherein said second pull-down transistor is prevented from turning on when the negative bias voltage is not coupled to said power amplifier.

7. A radio device according to claim 6 wherein the negative bias voltage is coupled to said pull-down node when the negative bias voltage is applied to said power amplifier.

8. A radio device according to claim 7 wherein said second pull-down transistor includes a control electrode electrically coupled to the supply ground voltage so that said second pull-down transistor is prevented from turning on when the negative bias voltage is not applied to said pull-down node.

9. A radio device according to claim 7 further comprising a pull-down resistance coupled between said pull-down node and the battery ground voltage so that said pull-down node is maintained at the battery ground voltage when the negative bias voltage is not applied to said power amplifier.

10. A radio device according to claim 7 wherein said second pull-down transistor includes a control electrode, an emitter electrode, and a collector electrode, said battery powered radio device further comprising:
- a diode coupled in series between said control electrode and the battery ground voltage.

11. A battery powered radio device according to claim 6 wherein said first and second pull-down transistors are provided on a common semiconductor substrate.

12. A battery powered radio device according to claim 1 wherein said control circuit further comprises:
- a detection circuit that generates a negative bias voltage signal when the negative bias voltage is applied to the power amplifier; and
- a logic circuit that activates said switch only when both the negative bias voltage signal and the transmit activation signal are present.

13. A radio device comprising:
- a transmitter that transmits radio communications wherein said transmitter comprises a power amplifier that generates an amplified radiofrequency output signal wherein said power amplifier uses both a positive supply voltage and a negative bias voltage for operation wherein said negative bias voltage is less than a supply ground voltage; and
- a control circuit that enables said power amplifier during transmission, said control circuit comprising a switch coupled in series between the positive supply voltage and said power amplifier, said switch comprising a control gate and being activated in response to a transmit activation signal by coupling a negative voltage with respect to the supply ground voltage to said control gate and wherein said control gate is deactivated in the absence of the transmit activation signal by coupling the positive supply voltage to said control gate;
- wherein the radio device is battery powered, wherein the positive supply voltage is a positive battery voltage, and wherein the supply ground voltage is a battery ground voltage.

14. A radio device according to claim 13 wherein said switch is activated in response to the transmit activation signal by coupling the negative bias voltage to said control gate.

15. A radio device according to claim 13 wherein said switch is activated in response to the transmit activation signal when the negative bias voltage is applied to said power amplifier, wherein activation of said switch in response to the transmit activation signal is prevented when the negative bias voltage is not applied to said power amplifier wherein said power amplifier receives the negative bias voltage at a negative bias voltage input, and wherein activation of said switch is prevented responsive to a feedback signal from said negative bias voltage input.

16. A radio device according to claim 13 wherein said power amplifier comprises a depletion mode GaAs FET power amplifier.

17. A radio device comprising:
- a transmitter that transmits radio communications wherein said transmitter comprises a power amplifier that generates an amplified radiofrequency output signal wherein said power amplifier uses both a positive supply voltage and a negative bias voltage for operation wherein said negative bias voltage is less than a supply ground voltage; and
- a control circuit that enables said power amplifier during transmission, said control circuit comprising a switch coupled in series between the positive supply voltage and said power amplifier, said switch comprising a control gate and being activated in response to a transmit activation signal by coupling a negative voltage with respect to the supply ground voltage to said control gate and wherein said control gate is deactivated in the absence of the transmit activation signal by coupling the positive supply voltage to said control gate;
- wherein said control circuit further comprises:
  - a pull-up resistance coupled between said control gate and said positive battery voltage; and
  - a pull-down transistor coupled in series between said control gate and a pull-down node wherein said pull-down transistor turns on responsive to said transmit activation signal and wherein the negative bias voltage is coupled to said pull-down node when the negative bias voltage is applied to said power amplifier.

18. A radio device according to claim 17 wherein said control circuit further comprises:
- a second pull-down transistor coupled in series with said first pull-down transistor between said control gate and said pull-down node wherein said second pull-down transistor is prevented from turning on when the negative bias voltage is not applied to said power amplifier.

19. A radio device according to claim 18 further comprising a pull-down resistance coupled between said pull-down node and the supply ground voltage so that said pull-down node is maintained at the supply ground voltage when the negative bias voltage is not applied to said power amplifier.

20. A radio device according to claim 19 wherein said second pull-down transistor includes a control electrode electrically coupled to the supply ground voltage so that said second pull-down transistor is prevented from turning on when the negative bias voltage is not applied to said pull-down node.

21. A radio device according to claim 18 wherein said first and second pull-down transistors are provided on a common semiconductor substrate.

22. A radio device according to claim 13 wherein said control circuit further comprises:
an operational amplifier having an output coupled with said control gate, a positive power input coupled to the positive supply voltage, a negative power input coupled to the negative bias voltage, and a signal input responsive to the transmit activation signal, wherein said operational amplifier couples the negative bias voltage to said control gate to activate said control gate and wherein said operational amplifier couples the positive battery voltage to said control gate to deactivate said control gate.

23. A radio device according to claim 22 wherein said control circuit further comprises:
a detection circuit which generates a negative bias voltage signal when the negative bias voltage is applied to the power amplifier; and
a logic circuit which activates said signal input of said operational amplifier only when both the negative bias voltage signal and the transmit activation signal are present so that the negative bias voltage is couple to said control gate only when both the negative bias voltage signal and the transmit activation signal are present.

24. A radio device comprising:
a transmitter that transmits radio communications wherein said transmitter comprises a power amplifier which generates an amplified radiofrequency output signal wherein said power amplifier uses both a positive supply voltage and a negative bias voltage for operation wherein said negative bias voltage is less than a supply ground voltage wherein said power amplifier receives the negative bias voltage at a negative bias voltage input;
a control circuit that enables said power amplifier during transmission, said control circuit comprising a switch coupled in series between the positive supply voltage and said power amplifier, said switch being activated in response to a transmit activation signal when the negative bias voltage is applied to said power amplifier; and
a lockout circuit wherein said lockout circuit prevents activation of said switch in response to the transmit activation signal when the negative bias voltage is not applied to said power amplifier wherein activation of said switch is prevented responsive to a feedback signal from said negative bias voltage input.

25. A radio device according to claim 24 wherein the radio device is battery powered, wherein the positive supply voltage is a positive battery voltage, and wherein the supply ground voltage is a battery ground voltage.

26. A radio device according to claim 24 wherein said switch comprises a control gate and wherein said switch is activated in response to the transmit activation signal by coupling a negative voltage with respect to the circuit ground voltage to said control gate and wherein said switch is deactivated in the absence of the transmit activation signal by coupling the positive supply voltage to said control gate wherein the radio device is battery powered, wherein the positive supply voltage is a positive battery voltage, and wherein the supply ground voltage is a battery ground voltage.

27. A radio device according to claim 26 wherein said switch is activated in response to a transmit activation signal by coupling the negative bias voltage to said control gate.

28. A radio device according to claim 24 wherein said power amplifier comprises a depletion mode GaAs FET power amplifier.

29. A method for transmitting radio communications from a radio including a transmitter having a power amplifier which generates an amplified radiofrequency output signal wherein the power amplifier uses both a positive supply voltage and a negative bias voltage for operation wherein the power amplifier receives the negative bias voltage at a negative bias voltage input and wherein the negative bias voltage is less than a supply ground voltage, said radio also including a switch between the power amplifier and the positive supply voltage, said method comprising the steps of:
turning on the switch in response to a transmit activation signal when the negative bias voltage is applied to the power amplifier; and
preventing the switch from being turned on in response to the transmit activation signal when the negative bias voltage is not applied to the power amplifier wherein activation of the switch is prevented responsive to a feedback signal from the negative bias voltage input.

30. A method according to claim 29 wherein the radio is battery powered, wherein the positive supply voltage is a positive voltage, and wherein the supply ground voltage is a battery ground voltage.

31. A method according to claim 29 wherein the switch comprises a transistor having a control gate, wherein said step of turning the switch on comprises coupling a negative voltage with respect to the supply ground voltage to the control gate, and wherein said step of preventing the switch from being turned on comprises coupling the positive supply voltage to the control gate wherein the radio is battery powered, wherein the positive supply voltage is a positive voltage, and wherein the supply ground voltage is a battery ground voltage.

32. A method according to claim 31 wherein said step of turning the switch on comprises coupling the negative bias voltage to the control gate.

33. A method according to claim 29 wherein said power amplifier comprises a depetion mode GaAs FET power amplifier.

34. A method according to claim 29 wherein said preventing step comprises:
generating a negative bias voltage signal when the negative bias voltage is applied to the power amplifier; and activating the control gate only when both the negative bias voltage signal and the transmit activation signal are present.

35. A method for transmitting radio communications from a radio including a transmitter having a power amplifier which generates an amplified radiofrequency output signal wherein the power amplifier uses both a positive supply voltage and a negative bias voltage for operation and wherein the negative bias voltage is less than a supply ground voltage, the radio also including a switch between the power amplifier and the positive supply voltage wherein the switch includes a control gate, wherein the radio is battery powered, wherein the positive supply voltage is a positive battery voltage, and wherein the supply ground voltage is a battery ground voltage, said method comprising the steps of:

turning on the switch by coupling the negative voltage with respect to the supply ground voltage to the control gate which is the battery ground voltage; and turning off the switch by coupling the positive supply voltage to the control gate.

36. A method according to claim 35 wherein said step of turning on the switch comprises turning on the switch by coupling the negative bias voltage to the control gate.

37. A method according to claim 35 wherein the step of turning the switch on is performed in response to a transmit activation signal when the negative bias voltage is applied to the power amplifier and wherein the power amplifier receives the negative bias voltage at a negative bias voltage input, said method further comprising the step of:

preventing the switch from being turned on in response to the transmit activation signal when the negative bias voltage is not applied to the power amplifier wherein activation of the switch is prevented responsive to a feedback signal from the negative bias voltage input.

38. A method according to claim 35 wherein the power amplifier comprises a depletion mode GaAs FET power amplifier.

* * * * *